US008723516B2

(12) United States Patent
Wheaton et al.

(10) Patent No.: US 8,723,516 B2
(45) Date of Patent: May 13, 2014

(54) B1-ROBUST AND T1-ROBUST SPECIES SUPPRESSION IN MRI

(75) Inventors: Andrew J. Wheaton, Shaker Heights, OH (US); James B. Murdoch, Solon, OH (US)

(73) Assignees: Kabushiki Kaisha Toshiba, Minato-Ku, Tokyo (JP); Toshiba Medical Systems Corporation, Otawara-Shi, Tochigi (JP)

(*) Notice: Subject to any disclaimer, the term of this patent is extended or adjusted under 35 U.S.C. 154(b) by 1065 days.

(21) Appl. No.: 12/713,548

(22) Filed: Feb. 26, 2010

(65) Prior Publication Data
US 2011/0210733 A1    Sep. 1, 2011

(51) Int. Cl.
*G01V 3/00*    (2006.01)

(52) U.S. Cl.
USPC ........................................ 324/307; 324/309

(58) Field of Classification Search
USPC ................... 324/307, 309, 312, 314
See application file for complete search history.

(56) References Cited

U.S. PATENT DOCUMENTS

| | | | |
|---|---|---|---|
| 5,142,231 A | 8/1992 | Jensen et al. | |
| 6,181,134 B1 * | 1/2001 | Wald | 324/307 |
| 6,304,084 B1 * | 10/2001 | Star-Lack et al. | 324/307 |
| 6,320,377 B1 | 11/2001 | Miyazaki et al. | |
| 7,772,844 B2 * | 8/2010 | Hurd | 324/309 |
| 8,248,070 B1 * | 8/2012 | Wheaton | 324/307 |

OTHER PUBLICATIONS

Dixon, "Simple Proton Spectroscopic Imaging", Radiology 1984; pp. 189-194.

Bydder et al., "The Short TI Inversion Recovery Sequence—An Approach to Mr. Imaging of the Abdomen", Magnetic Resonance Imaging, vol. 3, pp. 251-254, Nov. 3, 1985, pp. 251-254.

Yeung et al., "Separation of True Fat and Water Images by Correcting Magnetic Field Inhomogeneity in Situ", Radiology 1986; pp. 783-786.

Meyer et al., "Simultaneous Spatial and Spectral Selective Excitation", Magnetic Resonance in Medicine, Information Systems Laboratory, Stanford University, Stanford, California, pp. 287-304. (1990).

Glover, "Multipoint Dixon Technique for Water and Fat Proton and Susceptibility Imaging" JMRI 1991, pp. 521-530.

Glover et al., "Three-Point Technique for True Water / Fat Decomposition with B0 Inhomogeneity Correction", GE Medical Systems Group, Applied Science Laboratory, Magnetic Resonance in Medicine 18, pp. 371-383, (1991).

(Continued)

*Primary Examiner* — Louis Arana
(74) *Attorney, Agent, or Firm* — Nixon & Vanderhye PC

(57) ABSTRACT

An MRI multi-echo data acquisition sequence (REFUSAL=REFocusing Used to Selectively Attenuate Lipids) includes a spectrally-selective re-focusing RF pulse. The REFUSAL pulse can be non-spatially selective or spatially-selective. The REFUSAL pulse selectively refocuses water spins and avoids refocusing lipid spins. The REFUSAL pulse ideally maximizes refocusing for water and minimizes any lipid refocusing, with built-in robustness to B0-inhomogeneity and B1-inhomogeneity. Following the REFUSAL pulse, the remainder of the echo train continues in a conventional fashion. Only those spins that were refocused with the spectrally selective REFUSAL pulse continue to evolve coherently and generate a train of echoes. Those spins that were minimally refocused are spoiled and thus do not contribute signal to the final image. To incorporate a longer duration REFUSAL pulse, the echo spacing can be made non-uniform such that the first echo spacing is longer than the remainder of the echo spacings in the echo train.

26 Claims, 8 Drawing Sheets a REFUSAL pulse sequence

(56) References Cited

OTHER PUBLICATIONS

H. Kanazawa et al., "Contrast Naturalization of Fast Spin Echo Imaging: A Fat Reduction Technique Free from Field Inhomogeneity", p. 474, (1996).
K. Butts et al., "Dual Echo "Diet" Fast Spin Echo Imaging", Department of Radiology and Department of Electrical Engineering, Stanford University, Standford CA, 1 page, (1995).
Miyazaki et al., "A Polarity Altered Spectral and Spatial Selective Acquisition Technique", Toshiba Nasu Works, Tochigi, Japan, (1995).
H. Kanazawa et al., "A New Fat-Suppressed Fast Spin Echo Technique Using "Diet-Pasta"", Toshiba Nasu Works, Tochigi, Japan, Toshiba Research & Development Center, Kawasaki, Japan, p. 1547, (1994).
Mescher et al., "Water Suppression Using Selective Echo Dephasing", Center for Magnetic Resonance Research and Department of Radiology University of Minnesota, Minneapolis, MN, p. 384, (1996).
Meseher et al., "Solvent Suppression Using Selective Echo Dephasing", Center for Magnetic Resonance Research, University of Minnesota Medical School, Journal of Magnetic Resonance, Series A 123, Article No. 0242, pp. 226-229, (1996)
Kuroda et al., "Optimization of Chemical Shift Selective Suppression of Fat", Department of Radiology, Brigham and Women's Hospital and Department of Radiology, Children's Hospital, Harvard Medical School, Boston, MA, pp. 505-510, (1998).
Block et al., "Consistent Fat Suppression with Compensated Spectral-Spatial Pulses", Magnetic Resonance Systems Research Laboratory, Department of Electrical Engineering, Stanford University, Stanford, CA, pp. 198-206, (1997).
Star-Lack et al., Improved Water and Lipid Suppression for 3D Press CSI Using RF Band Selective Inversior with Gradient Dephasing (Basing), Magnetic Resonance Science Center, Department of Radiology, pp. 311-321, (1997).
Shick, "Simultaneous Highly Selective MR Water and Fat imaging Using a Simple New Type or Spectral-Spatial Excitation", Department of Diagnostic Radiology, University of Tubingen Germany, pp. 194-202, (1998).
Ma et al., "Method for Efficient Fast Spin Echo Dixon Imaging", Magnetic Resonance in Medicine, Department of Diagnostic Radiology, University of Texas M.D. Anderson Cancer Center, Houston, TX, pp. 1021-1027, (2002).
Reeder et al., "Iterative Decomposition of Water and Fat with Echo Asymmetry and Least-Squared Estimation (IDEAL): Application with Fast Spin-Echo Imaging", Magnetic Resonance in Medicine, Department of Radiology, Stanford University Medical Center, Stanford, CA, pp. 636-644, (2005).
Reeder et al., "Water-Fat Separation with IDEAL Gradient-Echo Imaging", Journal of Magnetic Resonance Imaging, Department of Radiology, University of Wisconsin, Madison, Wisconsin, pp. 644-652, (2007).
Lausestein et al., "Evaluation of Optimized Inversion-Recovery Fat-Suppression Techniques for T2-Weighted Abdominal MR Imaging", Journal of Magnetic Resonance Imaging, Department of Radiology, Emory University Hospital, Atlanta , GA, pp. 1448-1454, (2008).
Bley et al., "Fat and Water Magnetic Resonance Imaging", Journal of Magnetic Resonance Imaging, Department of Radiology, University of Wisconsin, Madison, Wisconsin, pp. 4-18 (2010).
Murdoch et al., "Computer-Optimized Narrowband Pulses for Multislice Imaging", Technicare Corporation, 29100 Aurora Road, Solon, OH, Journal of Magnetic Resonance, pp. 226-263, (1987).

\* cited by examiner

Typical BASING pulse sequence a REFUSAL pulse sequence

Comparison of B1-sensitivity of REFUSAL and CHESS in cervical spine. B1 amplitude was varied in a range of 80% - 120% of ideal.

Comparison of B1-sensitivity of REFUSAL and CHESS in lower lumbar. B1 amplitude was varied in a range of 80% - 120% of ideal.

|  | CHESS | PASTA | SPIR | SPAIR | STIR | DIET | Dixon / WFOP / IDEAL | Composite RF Pulse | REFUSAL |
|---|---|---|---|---|---|---|---|---|---|
| B1 sensitivity | xx | ● | — | ● | — | ● | ●● | ● | ● |
| B0 sensitivity | x | xx | x | x | ● | ● | ●● | x | x |
| T1 sensitivity | x | ● | x | x | x | ● | ● | ● | ● |
| Chemical Shift sensitivity | ● | ● | ● | ● | ● | ● | x | ● | ● |
| Time efficiency | ● | ● | — | — | — | x | xx | xx | — |
| Sequence Restrictions | ● | x | ● | ● | ● | x | xx | xx | — |

Fig. 8

Comparison of advantages and disadvantages of lipid suppression techniques for MR imaging. Closed circle indicates ● good performance. X indicates poor performance. A dash — indicates OK performance. Multiple marks indicate particular strength or weakness.

B1-ROBUST AND T1-ROBUST SPECIES SUPPRESSION IN MRI

BACKGROUND

1. Technical Field

This invention relates to magnetic resonance imaging (MRI) techniques for imaging a first nuclear magnetic resonance (NMR) species while suppressing the imaging of a second, different NMR species using a multi-spin echo MRI data acquisition sequence.

2. Related Art

In the following discussion, some acronyms and/or abbreviations are utilized. Although most, if not all, are familiar to those skilled in the art, a short listing of at least some of these acronyms/abbreviations is set forth below for convenience.

BASING=BAnd Selective INversion with Gradient dephasing

MEGA=MEscher GArwood (the authors)—a technique very similar to BASING

SAR=Specific Absorption Rate (of RF energy)

FSE=Fast Spin Echo—a common MRI pulse sequence

FASE=Fast Asymmetric Spin Echo (similar to FSE)

FOV=Field of View

SNR=Signal-to-Noise Ratio

B0=main static magnetic field

B1=transmitted RF magnetic field

T1=longitudinal NMR recovery time constant

T2=transverse NMR decay time constant

TR=repetition time between successive excitations for MRI imaging data acquisition sequence ppm=parts per million (unit of measure of frequency offset or deviation)

CHESS=CHEmically Selective Suppression

SPAIR=SPectral (-ly selective) Adiabatic Inversion Recovery

SPIR=SPectral (-ly selective) Inversion Recovery

STIR=Short Tau Inversion Recovery

PASTA=Polarity Alternated Spectral and spaTial Acquisition (excite and refocus pulses have opposite gradient polarities)

DIET=Dual Interval Echo Train (initial echo interval is longer than repeated echo train interval)

WFOP=Water-Fat Opposed Phase

IDEAL=a manufacturer's commercial name for a Dixon-like fat suppression method.

Lipid suppression in MRI is critical to achieve good image quality in regions where lipid signal obscures anatomy of interest. There exist several techniques designed to leverage the chemical shift difference between water and lipid (4.67 ppm v. ~1.3 ppm) including spectrally-selective saturation (CHESS) and alternate polarity slice select gradients to only refocus water signal (PASTA). Another family of techniques separates water from lipid using the phase evolution of transverse magnetization due to chemical shift difference (Dixon, IDEAL, WFOP). Somewhat related are spectral-spatial binomial RF pulses to selectively excite water and exclude lipid. Other techniques take advantage of the shorter T1 of lipid (~250 ms v. ~1000 ms water) to null lipid signal (STIR, SPIR, SPAIR). Still other techniques use the short T2 and strong J-modulation of lipid to attenuate lipid using irregular echo spacing (DIET).

The values for lipid chemical shift and T1 expressed above are quoted for the dominant methylene ($CH_2$) component of lipid. However other lipid components such as methyl groups ($CH_3$) and $CH_2$ protons shifted by proximity to carbonyls or double bonds are also present. In addition, there are olefinic protons at 5.3 ppm (i.e., relative to the tetramethylsilane (TMS) standard defined as 0.0 ppm), but these are too close to water (e.g., water at 4.7 ppm is only spaced 0.6 ppm from olefinic protons at 5.3 ppm) for any chemical shift-based technique to remove them. Therefore, lipid T1s can range over 100's of milliseconds and chemical shifts can range over 1.5 ppm. For more discussion, see Kuroda et al, "Optimization of Chemical Shift Selective Suppression of Fat", *Magn. Reson. Med.* 1997; 40:505-510. In addition, in a clinical MR experiment both B1 and B0 homogeneity can be non-uniform over the FOV. Especially at high field (e.g., 3 T), the range can be as great as +/−40% for B1 and 100's of Hz for B0 depending on the local anatomy.

Each MR imaging lipid suppression technique has advantages and disadvantages that make it suited to a particular application given the experimental B1 and B0 homogeneity and sequence constraints. The general advantages and disadvantages are summarized in the table of FIG. 8.

The BASING/MEGA technique in spectroscopy provides good T1-insensitivity, B1-insensitivity, time efficiency, and chemical shift robustness with minimal sequence restrictions. However, using this technique for imaging in its original spectroscopy manifestation (inverting fat and crushing its signal with opposing gradients while not refocusing water) would create a very long first echo. Furthermore, the RF pulse designs typically used in this technique can, as a function of offset frequency, alter the phase of the spins that are supposed to be left unaffected. Therefore, it is necessary to apply a matched pair of these rf pulses to unwrap the phase variation in order to produce a uniform phase profile over the width of the water resonance.

Some of these prior art techniques are described in references such as the following:

Dixon, "Simple proton spectroscopic imaging," *Radiology*, 1984; 153:189-194

Bydder, et al., "The Short T1 Inversion Recovery Sequence—An Approach to MR Imaging of the Abdomen" in *Magn. Reson. Imaging*, 1985; 3:251-254

Yeung, at al., "Separation of true fat and water images by correcting magnetic field inhomogeneity in situ," *Radiology*, 1986; 159:783-786

Meyer, et al., "Simultaneous spatial and spectral selective excitation," *Mag. Res. Med.*, 1990; 15:287-304

Glover, "Multipoint Dixon technique for water and fat proton and susceptibility imaging," *J. Mag. Res. Imag.* 1991, 1:521-530

Glover, et al., "Three-point Dixon technique for true water/fat decomposition with $B_0$ inhomogeneity correction," *Mag. Res. Med.*, 1991; 18:371-383

Kanazawa, at al., "Contrast naturalization of fast spin echo imaging: A fat reduction technique free from field inhomogeneity" in *PROC., SMR, $2^{nd}$ Annual Meeting*, San Francisco, 1994; page 474

Butts, et al., "Dual echo DIET fast spin echo imaging" in *PROC., SMR, $3^{rd}$ Annual Meeting*, Nice, 1995; page 651

Miyazaki, et al., "A polarity altered spectral and spatial selective acquisition technique" in *PROC., SMR, $3^{rd}$ Annual Meeting*, Nice, 1995; page 657

Kanazawa, et al., "A new fat-suppressed fast spin echo technique using DIET-PASTA" in *PROC., ISMRM, $4^{th}$ Annual Meeting*, New York, 1996; page 1547

Mescher, et al., "Water suppression using selective echo dephasing" in *PROC., ISMRM, $4^{th}$ Annual Meeting*, New York, 1996; page 384

Mescher, et al., "Solvent suppression using selective echo dephasing," *J. Mag. Res.*, Series A, 1996: 123:226-229

Kuroda et al, "Optimization of Chemical Shift Selective Suppression of Fat", *Magn. Reson. Med.* 1997; 40:505-510.

Block, et al., "Consistent fat suppression with compensated spectral-spatial pulses," *Magn. Reson. Med.*, 1997; 38:198-206

Star-Lack, et al., "Improved water and lipid suppression for 3D PRESS CSI using RF band selective inversion with gradient dephasing (BASING)," *Mag. Res. Med.*, 1997; 38:311-321

Schick, "Simultaneous highly selective MR water and fat imaging using a simple new type of spectral-spatial excitation," *Mag. Res. Med.*, 1998; 40:194-202

Ma, et al., "Method for efficient fast spin echo Dixon imaging," *Mag. Res. Med.*, 2002; 48:1021-1027

Reeder, et al., "Iterative decomposition of water and fat with echo asymmetry and least-squares estimation (IDEAL): application with fast spin-echo imaging," *Mag. Res. Med.*, 2005; 54:636-644

Reeder, et al., "Water-fat separation with IDEAL gradient-echo imaging," *J. Mag. Res. Imag.*, 2007; 25:644-652

Lauenstein, et al., "Evaluation of optimized inversion-recovery fat-suppression techniques for 12-weighted abdominal MR imaging," *J. Mag. Res. Imag.*, 2008; 27:1448-1454

Bley, et al., "Fat and water magnetic resonance imaging," *J. Mag. Res. Imag.*, 2010; 31:4-18

Jensen, et al., U.S. Pat. No. 5,142,231.

Miyazaki, of al., U.S. Pat. No. 6,320,377

For example, the above-cited Block, et al. paper describes an example of the use of spectral-spatial binomial RF pulses to selectively excite water and exclude lipid.

In MR spectroscopy, the BASING and MEGA techniques have been used to edit water and/or fat from spectra. These techniques work by including spectrally-selective 180° RF pulses (e.g., see FIG. 2) that invert water and/or lipid resonances and leave metabolites of interest (1.9-3.6 ppm) undisturbed. A pair of alternate polarity $G_x$ or $G_y$ gradient crushers surrounds each spectrally selective RF pulse (e.g., as shown in FIG. 2) to spoil only inverted magnetization. Since these techniques operate on transverse magnetization, they are inherently T1-insensitive.

The design of narrowband RF excitation pulses for multi-slice imaging is also known. See, for example:

Murdoch, et al., "Computer-optimized narrowband pulses for multislice imaging," *J. Meg. Res.*, Vol. 74, pages 226-263 (1987).

In spite of all this prior work on separating water and lipid MR images, there continues to be a need for a more B1-robust and T1-robust MRI technique for lipid suppression.

BRIEF SUMMARY

The exemplary embodiments utilize the concept of spectral editing in a manner conductive to MR imaging. The new technique is here referred to by the acronym REFUSAL (RE-Focusing Used to Selectively Attenuate Lipids).

REFUSAL works on RF echo train-based sequences (e.g., FSE, FASE). An RF refocusing pulse of the echo train is made to be spectrally-selective. This can be accomplished with either a non-spatially selective, spectrally-selective pulse (preferred embodiment) or a spatial-spectral composite selective pulse (alternative embodiment).

In an exemplary embodiment, a spectrally selective pulse is used to selectively refocus water spins and avoid refocusing lipid spins. The REFUSAL RF pulse can be designed in any manner, but ideally maximizes refocusing for water and minimizes any lipid refocusing, with built-in robustness to B0-inhomogeneity and B1-inhomogeneity.

In an exemplary embodiment, the REFUSAL pulse is inserted into the first refocus position in an RF echo train of N (N>1) refocus pulses. Following the REFUSAL pulse, gradient crusher(s) de-phase residual transverse magnetization. To incorporate a possibly long duration REFUSAL pulse, the echo spacing can be made non-uniform; specifically, the first echo spacing can be made longer than the remainder of the echo spacings in the echo train.

In this exemplary embodiment, following the REFUSAL pulse, the remainder of the echo train continues in a conventional fashion. Thus, only those spins that were refocused with the spectrally selective refocus pulse continue to evolve coherently and generate a train of echoes. Those spins that were minimally refocused are spoiled and thus do not contribute signal to the final image.

That is, such a spectrally selective RF refocusing pulse allows desired resonances (e.g., water) that are thereby refocused to later continue to evolve in the echo train. Unwanted resonances (e.g., lipid) are minimally refocused, dephased by the HD-crushers, and thus "refused" from later propagating in the ensuing echo train.

In BASING/MEGA, the spectrally-selective RF pulse is designed to avoid the desired metabolite resonances and hence the crusher gradients are of opposite polarities. In REFUSAL, it is desired to refocus the desired resonance (e.g., water) and hence a uni-polar FID-crusher pair is used.

In the case of the non-spatially selective embodiment, the first echo after the spectrally-selective refocusing pulse is discarded. REFUSAL generates images with CHESS-like image contrast without the evident disadvantages of CHESS.

The exemplary embodiment includes method and apparatus for implementing a B1-robust and T1-robust lipid suppression MRI data acquisition sequence—as well as a machine-implemented method for designing such an MRI echo train, a programmed computer system for doing so and a computer-readable storage medium containing at least one computer program for designing/implementing such an MRI data acquisition sequence.

As with many MRI data acquisition sequences, a TR interval of the sequence is initiated by applying, to an object to be imaged, an initial NMR RF nutation pulse (i.e., an excitation pulse) which nutates NMR nuclei in at least a desired portion of the object to be imaged. For example, it might be a spatially-selective (e.g., slice-selective) 90° nutation pulse. As those in the art will appreciate, depending upon the bandwidth of the initiating pulse, different NMR species may be nutated by approximately equal amounts (e.g., water nuclei and fat nuclei)—especially where the Larmor frequency of such species is closely spaced. That is, this initial NMR pulse is not spectrally-selective in the sense used herein to describe a later special REFUSAL spectrally-selective refocusing pulse.

After the initial nutation of at least first and second NMR nuclei species, the exemplary embodiments then apply a spectrally-selective phase-modulated 180° nutation pulse so as to selectively nutate a first species of NMR nuclei by substantially 180° while substantially avoiding nutation of a second different species of NMR nuclei—thereby selectively causing subsequent NMR refocusing of the first species, but not of the second species. Although the exemplary embodiments here described in detail use a phase-modulated spectrally-selective RF pulse, an appropriate spectrally-selective REFUSAL pulse does not need to be phase-modulated. For practical reasons, the exemplary REFUSAL pulse was designed to be phase-modulated (to improve B0/B1 performance, shorten time, create an asymmetric inversion profile).

But such is not required as there are other non-phase-modulated ways to design a spectrally-selective pulse.

Preferably the special REFUSAL refocusing pulse is applied as the first refocusing pulse following the TR initiating excitation pulse in an MRI data acquisition echo train. In the exemplary embodiment, this spectrally-selective phase-modulated REFUSAL nutation pulse is applied without any magnetic gradient field and thus is non-spatially-selective but, instead, only spectrally-selective in its effects.

As those in the art will appreciate, to be effective, such a spectrally-selective phase-modulated nutation pulse will likely need to be of substantial duration. However, after having thus selectively refocused the first species, a subsequent train of time-spaced normal or regular (i.e., not spectrally-selective, phase modulated, etc) 180° NMR RF refocusing pulses having relatively shorter spacing in the time domain can be used to successively refocus the first species of NMR nuclei. However, since the second species was not earlier refocused by the REFUSAL pulse, the ensuing train of NMR RF spin-echo responses will substantially emanate only from the first species of NMR nuclei, but not the second. As will be understood by those in the art, this train of normal refocusing pulses can be associated with the usual phase-encoding magnetic gradient pulses so as to produce a respectively corresponding train of phase-encoded NMR RF spin-echo responses emanating from that first species of NMR nuclei.

The train of RF spin-echo responses from the first species is then acquired as MRI data and stored to represent the same in a computer-readable memory and/or is used to produce an image of the first species of nuclei—using conventional imaging processes, as will be understood by those in the art.

In the exemplary embodiment, the first NMR RF spin-echo response formed immediately after the spectrally-selective phase-modulated NMR RF 180° nutation pulse is not used for imaging purposes (because the REFUSAL pulse was not spatially selective). Furthermore, in the exemplary embodiment, uni-polar magnetic gradient FID-crusher pulses are applied between the spin-echo responses (i.e., in pairs with one occurring before and one occurring after each RF refocusing pulse) in the train of spin-echo responses just mentioned.

In the exemplary embodiment, the first species is water and the second species is fat or lipid and the half-width refocusing and rejection bandwidths (i.e., for water and lipid, respectively) of the REFUSAL pulse are dimensioned to be within approximately 1.5-3.0 parts per million (ppm). There is only about 3.5 ppm frequency difference between water and fat species. In general, a longer duration phase-modulated spectrally selective RF pulse can provide a narrower passband and/or rejection band. However, in a preferred embodiment, the bandwidths should be large enough to compensate for B0 variations on the order of 1+ ppm while being narrow enough to effectively separate refocusing effects on water and expected species of fat over a wide range of B1 variation.

In one exemplary embodiment, the spectrally-selective phase-modulated RF nutation pulse is of approximately 8 milliseconds (ms) duration and effects approximately 2.2 ppm half-width water refocusing bandwidth and approximately 2.4 ppm half-width lipid rejection bandwidth. In a machine-implemented method for designing such an echo train to be spectrally-selective, B1-robust and T1-robust, a programmed computer system is configured to accept input design specification data effectively defining an NMR refocusing bandwidth for a first NMR species and an NMR rejection bandwidth for a second NMR species. In the present exemplary embodiment, other portions of the REFUSAL bandwidth are not constrained (e.g., so as to facilitate a shorter duration REFUSAL pulse). Using known spectrally-selective RF nutation pulse design techniques (e.g., see Murdoch et al cited above), the desired spectrally-selective phase-modulated 180° NMR RF nutation pulse is then designed so as to selectively nutate a first species of NMR nuclei by substantially 180° while substantially avoiding nutation of a second different species of nuclei, thereby causing NMR refocusing of the first species, but not of the second species.

The exemplary method then defines a complete MRI data acquisition sequence using the calculated spectrally-selective phase-modulated RF nutation pulse (i.e., of a type previously described). The thus-defined complete MRI data acquisition sequence may be output to a computer-readable memory (e.g., for use in a diagnostic MRI scan).

In an exemplary embodiment, it is also possible to provide an optimization option in the machine-implemented design method so that, depending upon a previously calculated design result, some or all steps in the design process can be repeated using different input design specification data.

BRIEF DESCRIPTION OF THE DRAWINGS

These and other objects and advantages of the exemplary embodiments will be more completely understood and appreciated in conjunction with the accompanying drawings, wherein:

FIG. 8 is a table comparing advantages and disadvantages of various lipid suppression techniques for MRI.

DETAILED DESCRIPTION OF EXEMPLARY EMBODIMENTS

Figure 1:
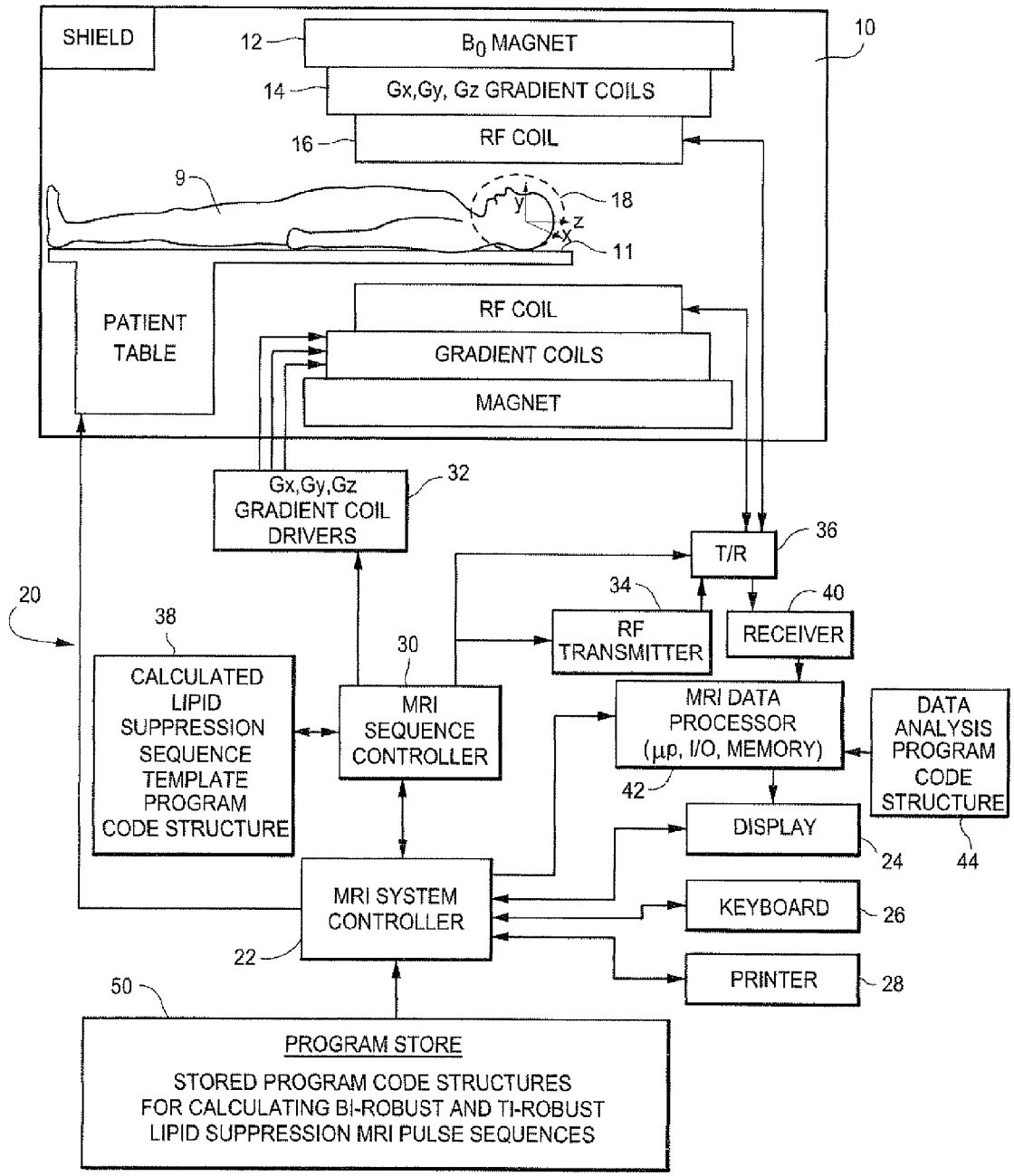
FIG. 1 is a simplified high-level block diagram of a typical MRI system modified so as to practice exemplary embodiments of the present invention.

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field $B_0$ magnet 12, a $G_x$, $G_y$, and $G_z$ gradient coil set 14 and an RF coil assembly 16. Along the horizontal axis of this cylindrical array of elements is an imaging volume 18 shown as substantially encompassing the head of a patient 9 supported by a patient table 11.

An MRI system controller 22 has input/output ports connected to display 24, keyboard 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as the RF transmitter 34 and the transmit/receive switch 36 (if the same RF coil is used for both transmission and reception). The MRI sequence controller 30 includes suitable program code structure 38 for implementing a calculated B1-robust and T1-robust MRI sequence and/or with other (e.g., conventional) MRI sequences already available in the repertoire of the MRI sequence controller 30.

The MRI system 20 includes an RF receiver 40 providing input to data processor 42 so as to create processed image data to display 24. The MRI data processor 42 is configured for access to a data analysis program code structure 44 for deriving, storing and/or displaying MR images based on MRI data acquired from the receiver 40.

Also illustrated in FIG. 1 is a generalized depiction of an MRI system program store 50 where stored program code structures (e.g., for calculating B1-robust and T1-robust MRI pulse sequences) are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high-level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of calculation of a REFUSAL echo train MRI sequence, an array of computer-readable accessible data value storage sites in physical storage media will be transformed from some prior state (e.g., all uniform "zero" values or all "one" values) to a new state, wherein the physical states at the physical sites of such an array vary between minimum and maximum values to represent real world physical events and conditions (e.g., the calculated REFUSAL echo train MRI pulse sequence to be used in acquiring MRI data). As those in the art will appreciate, such arrays of stored data values represent and also constitute a physical structure—as does a particular structure of computer control program codes which, when sequentially loaded into instruction registers and executed by one or more CPUs of the MRI system 20, cause a particular sequence of operational states to occur and be transitioned through within the MRI system.

The exemplary embodiments described below provide ways to calculate more B1-robust and T1-robust MRI multi-echo pulse sequences for MRI data acquisition.

Figure 2:
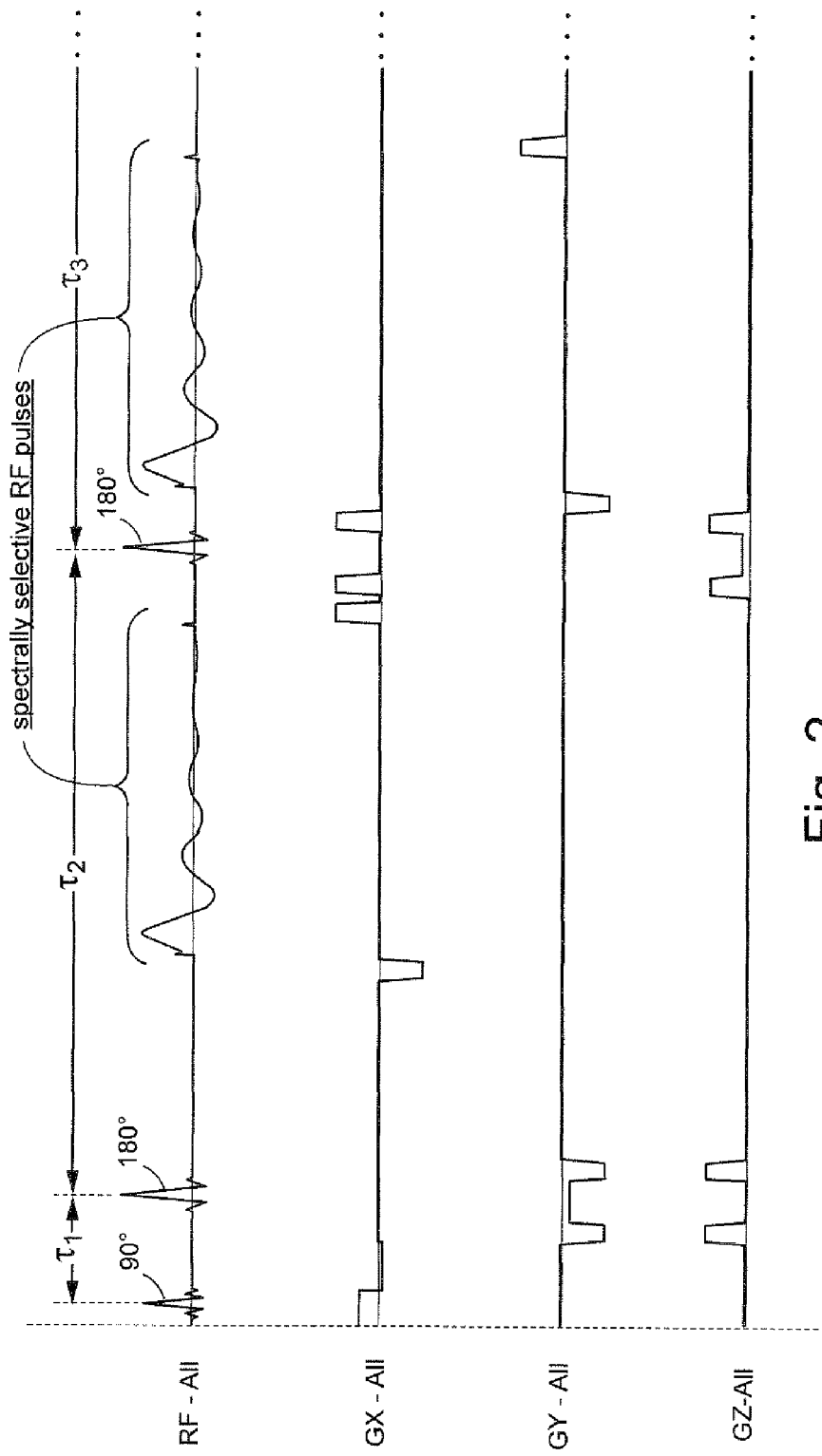
FIG. 2 depicts a prior art BASING pulse sequence previously used in NMR spectroscopy.

As previously mentioned, FIG. 2 depicts a BASING pulse sequence where the BASING pulses are shown within the dotted line boxes. As will be seen, there are alternate polarity FID-crusher pulse pairs (a pair of $G_x$ or a pair of $G_y$) associated with each spectrally-selective BASING pulse. Here, the spectrally-selective BASING RF pulse inverts water and lipid resonances, but leaves metabolites of interest (e.g., 1.9-3.6 ppm) undisturbed. The pair of alternate polarity gradient crushers that surround each BASING RF pulse spoils only the inverted magnetizations. Since these techniques operate on transverse magnetization, they are also inherently T1-insensitive. It will also be noted that the BASING pulse sequence uses BASING pulses interleaved between non-spectrally-selective "conventional" 180° refocusing pulses. The sequence shown in FIG. 2 is for NMR spectroscopy (i.e., not MRI).

Figure 4:
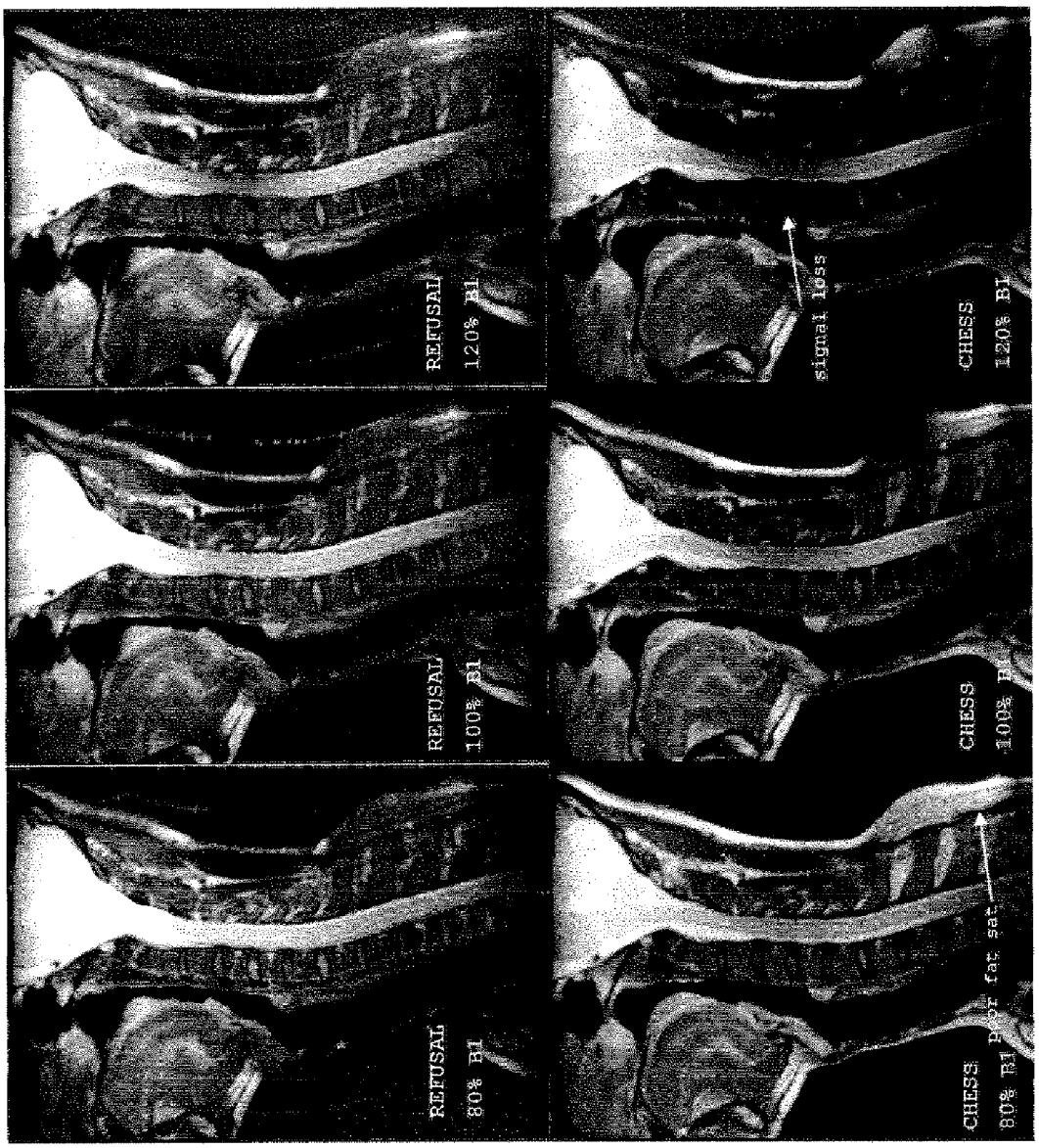
FIG. 4 comprises an array of six photographs comparing B1-sensitivity of REFUSAL and CHESS in cervical spine images where the B1 amplitude was varied within a range of 80%-120% of ideal nutation angle for each technique and areas of poor fat saturation and signal loss are identified on the CHESS images, while the REFUSAL images produced comparatively uniform signal and fat saturation across the same range of B1 variation.
Figure 5:
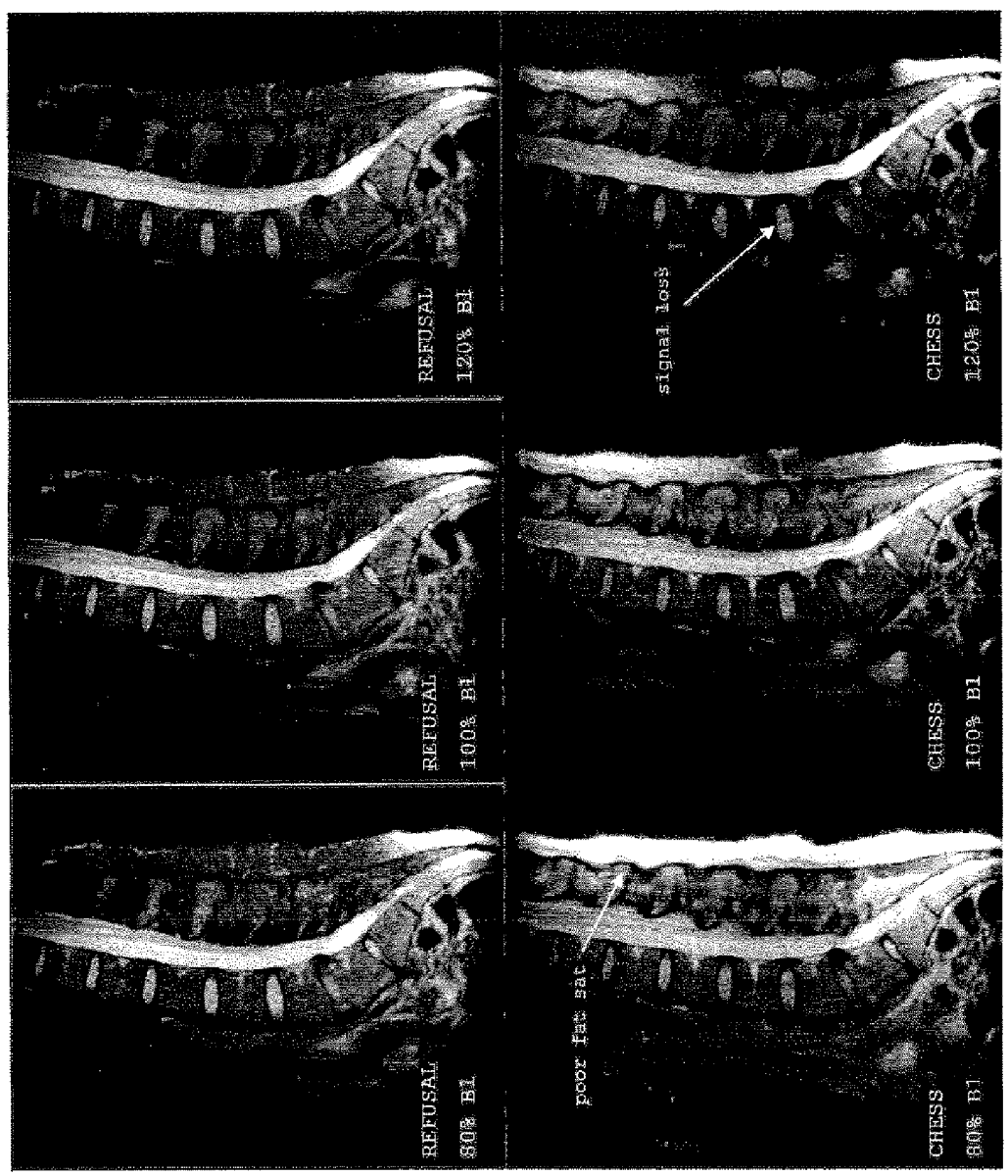
FIG. 5 comprises another array of six photographs comparing B1-sensitivity of REFUSAL and CHESS in lower lumbar images where B1 amplitude was varied again in a range from 80% to 120% of ideal nutation angle for each technique and areas of poor fat saturation and signal loss are identified on the CHESS images, while the REFUSAL images produced comparatively uniform signals and fat saturation across the same range of B1 variations.

The exemplary REFUSAL RF pulse design includes several features conducive for inclusion in MR imaging. The spectral selection profile includes a sharp transition between water and lipid to maximize the bandwidth (BW) of full refocusing for water, while maintaining near zero refocusing for a wide range of lipid chemical shifts (FIG. 6B). As depicted in FIGS. 4, 5 and 6B, the REFUSAL pulse is designed to produce uniform behavior over a wide range of B1 lipid suppression.

Figure 6A:
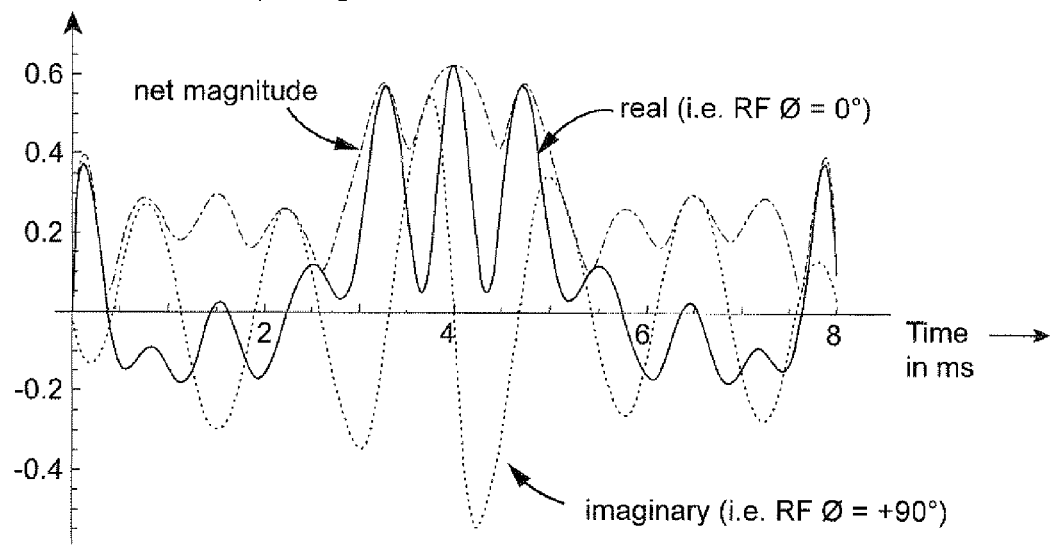
FIGS. 6A and 6B respectively depict an exemplary non-spatially-selective, spectrally-selective REFUSAL RF nutation pulse at FIG. 6A in the time domain and the resulting water passband and lipid rejection band in the frequency domain at FIG. 6B.
Figure 6B:
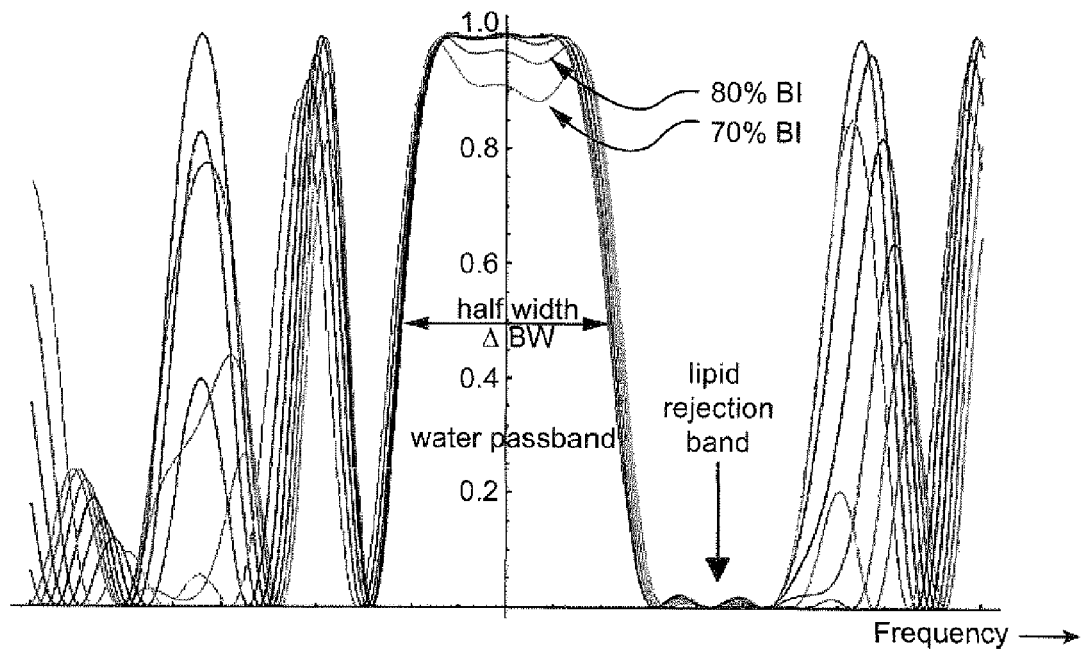

The waveform in FIG. 6A depicts exemplary RF envelope magnitudes for the real (solid line) as well as imaginary (dotted line) and net magnitude (dot-dashed line). That is, the exemplary REFUSAL spectrally-selective phase-modulated RF pulse is designed in phase-quadrature components (i.e., the "imaginary" component being phase-shifted by +90° with respect to the "real" component). As those in the art will appreciate, the RF NMR signal will have an RF center frequency defined by the well known Larmor equation (e.g., many tens of megahertz for typical magnetic field strengths of 0.5-3.0 Tesla), while the envelope of quadrature components thereof changes at a much slower rate (e.g., on the order of 1 kilohertz or so).

FIG. 6B depicts a typical refocusing profile for a REFUSAL pulse in the exemplary embodiment in the frequency domain. Here multiple overlaid plots indicate performance for a range of 70% to 130% of desired B1 fields, As can be seen, for the water resonance passband, 70% and 80% B1 field strengths still produce only slightly less than full desired refocusing effect (e.g., on the order of 90-95% of full refocusing effect). At the same, time, it will be seen that the lipid rejection band is effective over the entire range of B1 variation (e.g., less than 2% refocusing effect) so as to maintain substantially complete rejection of the lipid refocusing effects.

The exemplary embodiments have used a water pass bandwidth of about 2.2 ppm and a fat rejection bandwidth of about 2.4 ppm, each centered at substantially their respective nominal NMR resonant frequencies. However it should be understood that different bandwidths and/or different relative positions of these bandwidths can also be used. For example, with the pass and rejection bandwidths still centered on the respective nominal NMR resonant frequencies of water and fat, it is possible to use somewhat narrower and/or wider pass and/or rejection bandwidths. If the center of the water pass band is shifted to the left (i.e., away from fat) and if the center of the fat rejection band is shifted to the right (i.e., away from water), it is possible to adjust these bandwidths considerably more (e.g., up to a maximum of approximately 5 ppm or so).

To incorporate these RF performance features, the duration of the exemplary REFUSAL pulse is relatively long compared to normal imaging pulses used in the subsequent echo train. In this example, the REFUSAL pulse was 8.0 ms in duration (compared to 1.3 ms duration for subsequent normal imaging refocusing pulses). If a longer echo spacing (e.g., perhaps 10+ ms) is not desirable for a given application, design trade-offs can be made with the REFUSAL pulse to shorten its duration. Alternatively, the initial echo spacing can be extended a small amount (much less so than with DIET) followed by a train of regular short echo spacings. In this example, an initial echo spacing $2\tau_1$ of 13.0 ms was used, followed by a train of 6.5 ms $2\tau_2$ echo spacings (e.g., see FIG. 3)

REFUSAL includes the T1-robustness, B1-robustness, time-efficiency and chemical shift advantages of BASING/MEGA—but in an implementation conducive to MR imaging. For example, the REFUSAL sequence does not depend upon the T1 parameter of fat—and thus there is no necessity for a pre-pulse tied to the TR interval. The table in FIG. 8 compares REFUSAL to other lipid suppression techniques. Like any spectrally-selective technique, REFUSAL has the disadvantage of potential B0 sensitivity. Also, in the particular embodiment shown in this example, REFUSAL loses some SNR due to the discarding of the first echo data, possible loss of some echo coherences or isochromats dephasing due to diffusion (if the initial echo spacing is extended), and magnetization transfer effects from the side lobes of the REFUSAL pulse.

REFUSAL is conceptually similar to the DIET and PASTA techniques, but it is different in several respects. Spectrally-selective methods like REFUSAL are affected by B0 inhomogeneity, whereas DIET is immune. However, DIET uses a very long initial echo space on the order of T2 of fat (e.g., ~40 ms). The long initial echo space makes the minimum TE long and thus restricts DIET to T2-weighted imaging applications. Also, the longer initial echo space of DIET (~40 ms v. ~13 ms for REFUSAL) decreases SNR compared to REFUSAL. The very long, low bandwidth excite pulse of PASTA requires at least the first echo in an echo train to be long as well. Also, the low slice select gradient amplitude of PASTA generates slices that can be susceptible to warping from background B0 inhomogeneity.

Figure 3:
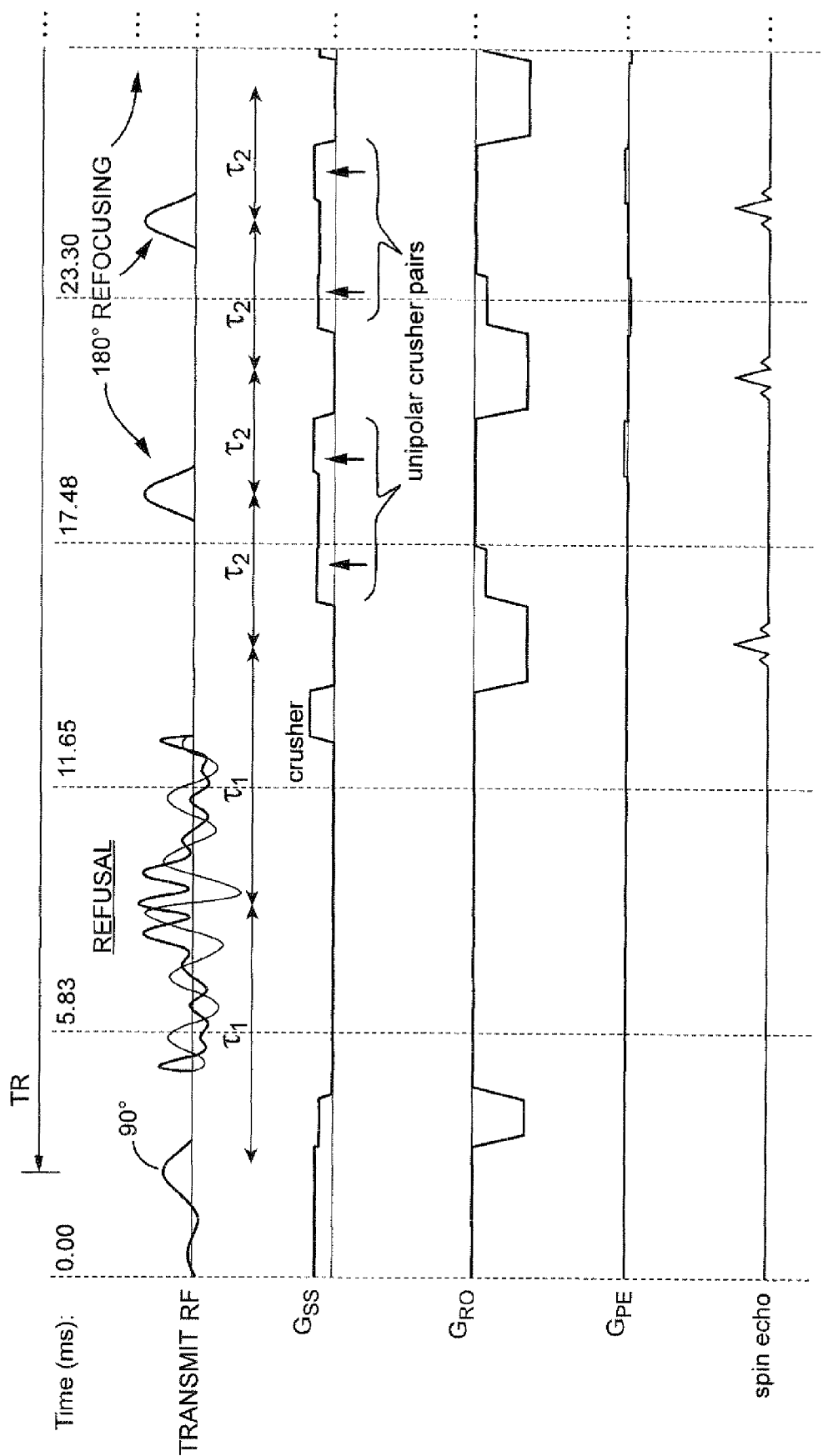
FIG. 3 is a schematic depiction of a first portion of a "REFUSAL" pulse sequence demonstrating one exemplary embodiment of a non-spatially-selective, spectrally-selective RF 180° nutation pulse.

As depicted in FIG. 3, an exemplary embodiment uses a non-spatially-selective, but spectrally-selective phase-modulated REFUSAL RF pulse as the first 180° refocusing pulse in the pulse train following the initial excitation pulse of a TR interval (e.g., a 90° nutation pulse). As depicted in FIG. 3, the initial 90° nutation pulse is shaped as an asymmetric sinc pulse envelope (so as to gain a bit more time for the relatively long REFUSAL pulse). The slice-select gradient $Gs_{SS}$ is on during the initial nutation pulse and during each "regular" 180° refocusing pulse of the sequence. In addition, uni-polar crusher pulses are used to attenuate FID responses.

Read-out gradient pulses $G_{RO}$ are applied at each echo time—and an initial pre-phasing (unwinding) gradient pulse is used as well, as will be appreciated by those in the art.

In the exemplary embodiment of FIG. 3, an irregular echo spacing is used. For example, the initial echo spacing is $2\tau_1$ (e.g., on the order of 13.0 ms), while subsequent echo spacing is much shorter at $2\tau_2$ (e.g., on the order of one-half, or 6.5 ms). In this particular embodiment, the first echo is preferably discarded because the REFUSAL spectrally-selective pulse was not spatially-selective (i.e., there is no magnetic gradient switched "on" during the REFUSAL pulse). The initial crusher pulse applied immediately after the REFUSAL pulse is preferably used to destroy any phase coherence of nuclei species not affected by the REFUSAL pulse passband and rejection band.

Lipid suppression in MRI is critical to achieve good image quality in regions where lipid signal obscures anatomy of interest. At high B0 fields (3 T+), changes in several physical properties can confound lipid suppression performance. The specific absorption rate (SAR) of RF pulse energy is proportional to the square of B0 and thus increases four-fold in going from 1.5 T to 3 T. This makes SAR a primary concern for high field applications of lipid suppression. The B1 transmit field also becomes more inhomogeneous, leading to inexact and varying nutation angles, and hence non-uniform lipid suppression, across the imaging field of view. Moreover, the longitudinal relaxation time (T1) substantially increases for most chemical species, which can disrupt T1-based lipid suppression techniques and lengthen scan times.

The REFUSAL sequence provides a novel technique for lipid suppression which is SAR-efficient and time-efficient and robust to the effects of variations in B1 and T1.

This technique works on RF-echo-train-based sequences (e.g., FSE, FASE). As shown in FIG. 3, preferably the first RF excitation pulse of the echo train is made to be spectrally-selective. This can be accomplished with either a non-spatially-selective, spectrally-selective pulse (preferred embodiment) or a spatial-spectral composite selective pulse (alternative embodiment). The first RF pulse allows desired resonances (e.g., water) that are fully refocused to evolve in the subsequent echo train. Unwanted resonances (e.g., lipid) are minimally refocused and dephased by the FID-crushers and, as a result, they are "refused" from propagating in the subsequent echo train. In BASING/MEGA, the RF pulse is designed to avoid desired resonances and hence the crusher gradients are of opposite polarity. In REFUSAL, the desired resonances are to be refocused and thus a uni-polar crusher pair is used. In the non-spatially-selective embodiment, the first echo is discarded.

REFUSAL generates images with CHESS-like image contrast without the evident disadvantages of CHESS (e.g., see FIGS. 4 and 5).

As shown in FIG. 4, B1-sensitivity of REFUSAL and CHESS MRI sequences for images of the cervical spine are markedly different. Here, the B1 amplitude is varied in a range between 80% and 120% of an ideal nutation angle for each technique. Areas of poor fat saturation and signal loss are identified on the CHESS images—while the REFUSAL technique continued to produce uniform signal and fat saturation across this range of B1 variation.

Similarly, FIG. 5 compares the B1-sensitivity of REFUSAL and CHESS images in the lower lumbar region. Here again, B1 amplitude was varied in a range of between 80% and 120% of the ideal nutation angle for each technique. Areas of poor fat saturation and signal loss are identified on the CHESS images—while REFUSAL produces images having uniform signal and fat saturation across this entire range of B1 variation.

The lower lumbar of a male volunteer was scanned on a Toshiba 3 T whole-body research system. REFUSAL images were acquired with the following parameters: TE/TR=78/3000 ms, ETL=27, matrix=256×256, FOV=28×28 cm, one 5 mm thick slice, readout BW=390 Hz/pixel. In this example, an initial echo spacing of 13.0 ms followed by a train of 6.5 ms echo spacings. For comparison, TE-matched FSE images with CHESS fat suppression were acquired with identical parameters. To test the response of REFUSAL to a range of B1 inhomogeneity, the experiment was repeated for a range of B1 amplitudes of the REFUSAL pulse (60% to 140% of ideal, in steps of 10%). The analogous experiment was performed on the CHESS data by adjusting the amplitude of the CHESS pre-pulse. In the B1=100% images, SNR was measured in the vertebrae for both techniques.

The results shown in FIG. 5 generated images with CHESS-like contrast without the evident B1-sensitivity of CHESS. SNR of REFUSAL was about 10-15% lower than CHESS. REFUSAL produced uniform fat suppression over a range of B1. For low B1, CHESS did not completely suppress fat. For high B1, CHESS produced non-uniform fat suppression and the sidelobes of the over-tipped CHESS pulse reduced water signal in the vertebrae.

Due to the exemplary embodiment use of a non-spatially selective but only spectrally-selective refocusing pulse, this example of REFUSAL is limited to single slice or 3D acquisitions. However, the spectrally-selective first pulse could be replaced by a spatial-spectral pulse to enable multi-slice acquisitions.

Figure 7:
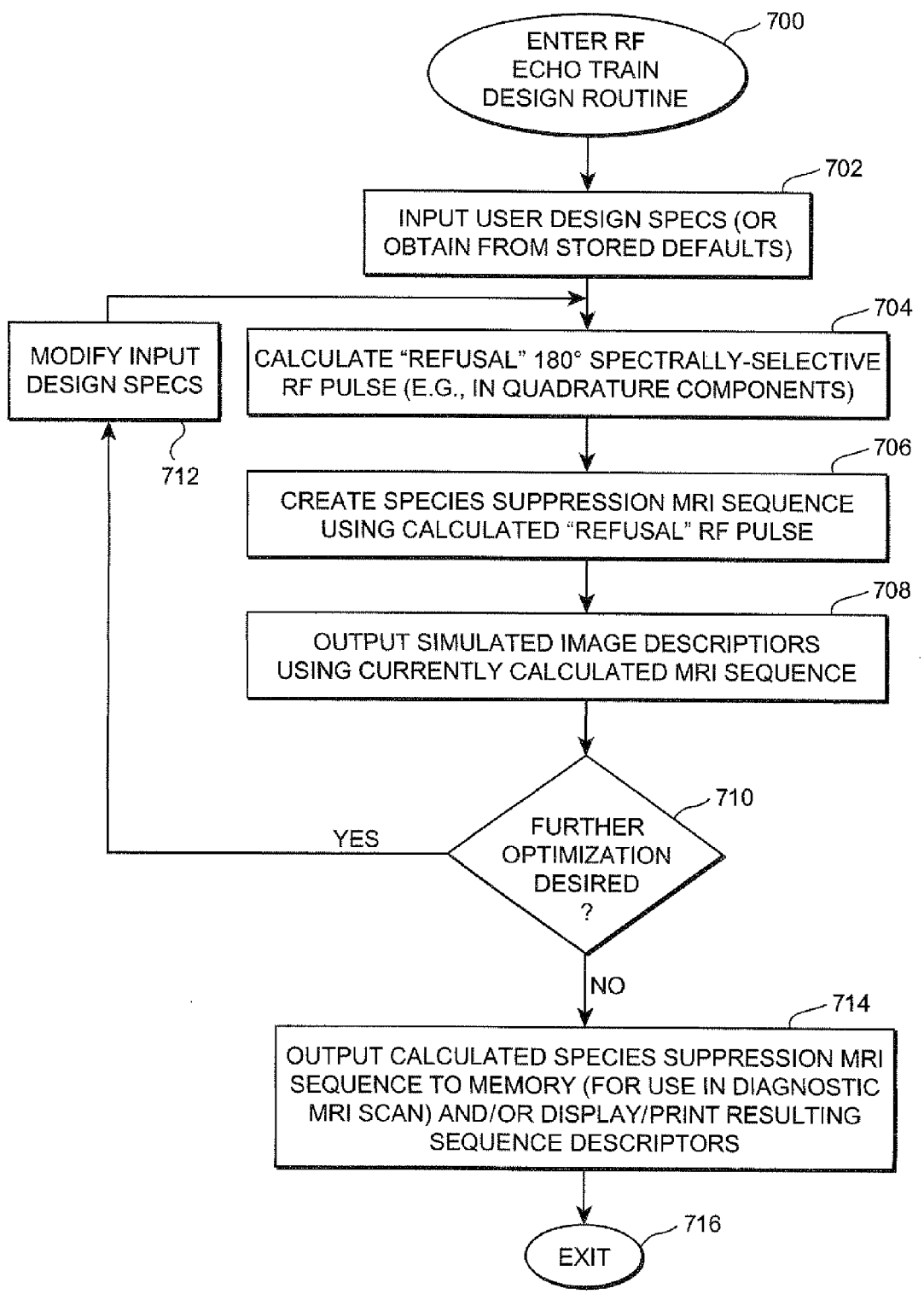
FIG. 7 is a high-level block diagram of computer program code structure that may be utilized to implement a machine-implemented design method/apparatus for achieving exemplary REFUSAL MRI data acquisition pulse sequences.

FIG. 7 illustrates a block diagram of computer program code structure that can be implemented in a suitably programmed computer system so as to design/implement an exemplary embodiment of the REFUSAL MRI pulse sequence.

For example, the RF echo train design routine may be entered at 700 and at 702, user design specifications (or stored default design specifications) may be input or fetched.

For example, the following might be input design specification parameters:
  imposed pulse symmetry: the in-phase ("real" or "x") component is symmetric about the center; the out-of-phase ("imaginary" or "y") component is antisymmetric
  pulse length=8 ms
  target width of the water refocusing band=280 Hz=2.188 ppm at 3 T (i.e., 140 Hz=1.094 ppm on either side of resonance)
  target width of the "don't care" transition zone between water and lipid=135 Hz=1.055 ppm at 3 T
  target width of the "no-refocus band" for lipids=305 Hz=2.383 ppm at 3 T
  range of relative overall B1 levels for which the desired profile is desired=85% to 145% of the nominally correct value
  maximum allowed pulse amplitude=700 Hz=16.4 microtesla.

These values were arrived at after some trial-and-error adjustment and may not be the very best set of possible pulse design parameters—but they have given rise to a usable pulse.

At 704, the "REFUSAL 180° spectrally-selective (possibly phase modulated) RF pulse is calculated (e.g., in quadrature components, possibly using the Murdoch, of al. optimization technique for spectral selectivity, etc., as explained in the above-cited paper).

At 706, a lipid (or other species as may be desired) suppression MRI sequence using the calculated REFUSAL RF pulse calculated at 704 is now created (e.g., using a subsequent train of conventional 180° refocusing pulses, phase encoding gradient pulses, read-out gradient pulses for spin echoes, etc.).

At 708, simulated results of using the just-calculated MRI data acquisition pulse sequence can be provided—followed by an option at 710 for further optimization after review of the current results. For example, if output simulated image descriptors using the currently calculated MRI sequence at 708 are not believed suitable or optimum, then a decision may be made at 710 to modify input design specifications at 712 and to return control to 704 where another REFUSAL pulse is calculated and the process is repeated. Of course steps 708 and 710 may be omitted—and/or the review of simulated results and option for modifying input design specifications may be entirely automated if desired.

In any event, when the MRI data acquisition pulse sequence design is completed, then at 710 the calculated lipid (or other species) suppression MRI sequence is output to memory for use in diagnostic MRI scans and/or for displaying/printing and the like—possibly including output of resulting sequence descriptors. The design routine may be exited then at 716.

The spectral selection properties of the REFUSAL pulse can be altered to maximize/minimize refocusing for different chemical species. For example, the REFUSAL pulse can be designed to selectively refocus a particular metabolite of interest and avoid refocusing water and/or fat.

More than one REFUSAL pulse can be used in the echo train. In the exemplary embodiments, however, one pulse sufficed for the purposes of lipid suppression.

If more than one REFUSAL pulse is used, the spectral selection profile of each pulse can be modified either by using different pulse shapes or simply adjusting the center frequency and/or bandwidth of each pulse.

The REFUSAL pulse(s) can be incorporated into the RF echo train with or without uniform echo spacing.

The spectrally-selective, non-spatially-selective REFUSAL pulse can be replaced with a spectrally-selective and spatially-selective pulse (e.g., a binomial pulse).

The REFUSAL pulse can be inserted at any point within the echo train. For maximum lipid suppression, however, the first refocus position is ideal.

REFUSAL includes the T1-/B1-robustness, SAR- and time-efficiency, and chemical shift advantages of BASING/MEGA, but in an implementation conducive to MR imaging. The table in FIG. 8 compares REFUSAL to other lipid suppression techniques with respect to their advantages and disadvantages.

REFUSAL works on transverse magnetization (already nutated into the transverse plane by the excitation pulse). Thus, REFUSAL is not affected by the overall T1 value, T1 variation within a chemical species, the effects of B0 field strength on T1, or user choice of design parameters (like nutation angle or T1, as in the case of SPIR, STIR, SPAIR and CHESS).

REFUSAL uses a B1-robust RF pulse operating at or near 180°. Thus, REFUSAL is B1-insensitive (as demonstrated in FIGS. 4 and 5).

REFUSAL does not necessitate using a pre-pulse or the acquisition of extra data (like Dixon or IDEAL methods). Thus, it is time-efficient.

REFUSAL does not include a pre-pulse that contributes extra SAR to the sequence.

By designing the REFUSAL RF pulse appropriately, REFUSAL can be used to attenuate any spectral range of chemical species.

REFUSAL involves no special reconstruction algorithms or restrictions, The acquired data can be directly reconstructed and processed using conventional methods.

REFUSAL does not impose sequence restrictions such as an elevated minimum TE (like DIET, PASTA), an elevated minimum slice thickness (like spectral-spatial excite), or a range of TEs (like Dixon, IDEAL).

Like any spectrally-selective technique, REFUSAL has the disadvantage of potential B0 sensitivity. If the center frequency of the MR system is not properly calibrated, or a variation in background susceptibility sufficiently warps the local B0 field, spectrally-selective RF pulses can excite/refocus unintended spins. This can result in poor performance, i.e., partial suppression of water and incomplete suppression of lipid.

Also, in the exemplary embodiment shown with non-uniform echo spacing, REFUSAL loses a small amount of SNR due to (a) the discard of the first echo data, (b) the loss of some stimulated-echo coherence pathways involving the spectrally selective pulse, (c) isochromat dephasing due to diffusion (if the initial echo spacing is extended), and (d) magnetization transfer effects from the side lobes of the REFUSAL pulse (in the embodiment of the REFUSAL pulse design described herein).

REFUSAL is limited to RF-echo-train-based pulse sequences (e.g., FSE, FASE). In its simpler preferred embodiment with pulses that are spectrally-selective, but not spatially-selective, it is restricted to 3D (or single-slice 2D) applications.

REFUSAL includes a spectrally-selective pulse within an echo train for the purposes of selectively attenuating a chemical species from contributing signal in an MR image. The REFUSAL sequence uses a spectrally-selective refocus pulse that delivers nearly constant maximum refocusing for the desired species of interest (e.g., water) and nearly constant minimum refocusing for the unwanted species of interest (e.g., lipid) over a range of relative B1 values.

While the above exemplary embodiments have been described in some detail, those skilled in the relevant art will understand that many variations and modifications may be made in these exemplary embodiments while still retaining one or more novel advantageous features of this invention. Accordingly, all such variations and modifications are intended to be included within the scope of the appended claims.

What is claimed is:

1. An MRI method comprising using an MRI system that has been configured to:
   apply, to an object to be imaged, an initial NMR RF nutation pulse which nutates by approximately equal degrees both a first and a second species of NMR nuclei in at least a portion of the object to be imaged;
   thereafter apply a spectrally-selective 180° RF nutation pulse to selectively nutate said first species of NMR nuclei by substantially 180° while substantially avoiding nutation of said second different species of nuclei, thereby selectively causing subsequent NMR refocusing of said first species but not of said second species;
   thereafter apply a time-spaced sequence of 180° NMR RF refocusing pulses which nutate both said first and second species by approximately equal degrees to successively refocus said first species of NMR nuclei but not said second species, said sequence of refocusing pulses also being associated with phase-encoding magnetic gradient pulses to produce a respectively corresponding train of phase-encoded NMR RF spin echo responses emanating from said first species of NMR nuclei; and
   acquire said train of RF spin echo responses as MRI data and to store data representing same in computer-readable memory and/or using said MRI data to produce an image of said first species of nuclei.

2. An MRI method as in claim 1, wherein an NMR RF spin echo response formed immediately after said spectrally-selective NMR RF nutation pulse is not used for imaging purposes.

3. An MRI method as in claim 1, wherein time-spacing between said initial RF nutation pulse and an NMR RF spin echo response formed immediately after said spectrally-selective 180° RF nutation pulse is longer than time-spacing between thereafter occurring NMR RF spin echo responses.

4. An MRI method as in claim 1, wherein said spectrally-selective pulse is phase-modulated.

5. An MRI method as in claim 1, wherein uni-polar magnetic gradient FID-crusher pulses are applied between said train of NMR RF spin echo responses.

6. An MRI method as in claim 1, wherein said first species is water and said second species is fat or lipid.

7. An MRI method as in claim 6, wherein the spectrally-selective RF nutation pulse is designed to effect:
   (a) half-width water refocusing bandwidth corresponding to at least 1.5 ppm, but less than 5.0 ppm at the NMR frequency of water; and
   (b) half-width lipid rejection bandwidth corresponding to at least 1.5 ppm, but less than 5.0 ppm at the NMR frequency of lipid.

8. An MRI method as in claim 7, wherein the spectrally-selective RF nutation pulse is phase-modulated, of approximately 8 ms duration and designed to effect:
   (a) half-width water refocusing bandwidth corresponding to approximately 2.2 ppm at the NMR frequency of water; and
   (b) half-width lipid rejection bandwidth corresponding to approximately 2.4 ppm at the NMR frequency of lipid.

9. An MRI method as in claim 1, wherein at least one magnetic gradient pulse is applied during said initial NMR nutation pulse and at least one magnetic gradient pulse is applied during each of said time-spaced sequence of 180° NMR RF refocusing pulses, thus making these RF pulses spatially-selective within said object to be imaged, but there being no magnetic gradient pulse applied during said spectrally-selective phase-modulated 180° RF nutation.

10. An MRI method as in claim 1, wherein said spectrally-selective 180° RF nutation pulse is also made spatially selective by application of at least one magnetic gradient pulse.

11. An MRI apparatus comprising:
   an RF transmitter configured to apply, to an object to be imaged, an initial NMR RF nutation pulse which nutates by approximately equal degrees both a first and a second species of NMR nuclei in at least a portion of the object to be imaged;
   said RF transmitter also being configured to thereafter apply a spectrally-selective 180° RF nutation pulse to selectively nutate said first species of NMR nuclei by substantially 180° while substantially avoiding nutation of said second different species of nuclei, thereby causing subsequent NMR refocusing of said first species but not of said second species;
   said RF transmitter also being configured to thereafter apply a time-spaced sequence of 180° RF refocusing pulses which nutate both said first and second species by approximately equal degrees to successively refocus said first species of NMR nuclei but not said second species, said sequence of refocusing pulses also being associated with phase-encoding magnetic gradient pulses to produce a respectively corresponding train of phase-encoded NMR RF spin echo responses emanating from said first species of NMR nuclei; and an RF receiver configured to acquire said train of RF spin echo responses as MRI data and to store data representing same in computer-readable memory and/or using said MRI data to produce an image of said first species of nuclei.

12. An MRI apparatus as in claim 11, wherein an NMR RF spin echo response formed immediately after said spectrally-selective NMR RF nutation pulse is not used for imaging purposes.

13. An MRI apparatus as in claim 11, wherein time-spacing between said initial RF nutation pulse and an NMR RF spin echo response formed immediately after said spectrally-selective 180° RF nutation pulse is longer than time-spacing between thereafter-occurring NMR RF spin echo responses.

14. An MRI apparatus as in claim 11, wherein said spectrally-selective pulse is phase-modulated.

15. An MRI apparatus as in claim 11, wherein uni-polar magnetic gradient FID-crusher pulses are applied between said train of NMR RF spin echo responses.

16. An MRI apparatus as in claim 11, wherein said first species is water and said second species is fat or lipid.

17. An MRI apparatus as in claim 16, wherein the spectrally-selective RF nutation pulse is designed to effect:
(a) half-width water refocusing bandwidth corresponding to at least 1.5 ppm, but less than 5.0 ppm at the NMR frequency of water; and
(b) half-width lipid rejection bandwidth corresponding to at least 1.5 ppm, but less than 5.0 ppm at the NMR frequency of lipid.

18. An MRI apparatus as in claim 17, wherein the spectrally-selective RF nutation pulse is phase modulated, of approximately 8 ms duration and designed to effect:
(a) half-width water refocusing bandwidth corresponding to approximately 2.2 ppm at the NMR frequency of water; and
(b) half-width lipid rejection bandwidth corresponding to approximately 2.4 ppm at the NMR frequency of lipid.

19. An MRI apparatus as in claim 11, wherein at least one magnetic gradient pulse is applied during said initial NMR nutation pulse and at least one magnetic gradient pulse is applied during each of said time-spaced sequence of 180° NMR RF refocusing pulses, thus making these RF pulses spatially selective within said object to be imaged, but there being no magnetic gradient pulse applied during said spectrally-selective 180° RF nutation.

20. An MRI apparatus as in claim 11, wherein said spectrally-selective 180° RF nutation pulse is also made spatially selective by application of at least one magnetic gradient pulse.

21. A non-transitory computer-readable medium containing at least one computer program which, when executed by at least one computer in an MRI system, effects the machine-implemented method comprising:
applying, to an object to be imaged, an initial NMR RF nutation pulse which nutates by approximately equal degrees both a first and a second species of NMR nuclei in at least a portion of the object to be imaged;
thereafter applying a spectrally-selective 180° RF nutation pulse to selectively nutate said first species of NMR nuclei by substantially 180° while substantially avoiding nutation of said second different species of nuclei, thereby selectively causing subsequent NMR refocusing of said first species but not of said second species;
thereafter applying a time-spaced sequence of 180° NMR RF refocusing pulses which nutate both said first and second species by approximately equal degrees to successively refocus said first species of NMR nuclei but not said second species, said sequence of refocusing pulses also being associated with phase-encoding magnetic gradient pulses to produce a respectively corresponding train of phase-encoded NMR RF spin echo responses emanating from said first species of NMR nuclei; and
acquire said train of RF spin echo responses as MRI data and to store data representing same in computer-readable memory and/or using said MRI data to produce an image of said first species of nuclei.

22. Apparatus for designing an MRI echo train that is spectrally-selective, B1-robust and T1-robust, said apparatus comprising a programmed computer system configured to:
(a) accept input design specification data effectively defining an NMR refocusing bandwidth for a first NMR species and an NMR rejection bandwidth for a second NMR species;
(b) calculate a spectrally-selective 180° NMR RF nutation pulse design for selectively nutating said first species of NMR nuclei by substantially 180° while substantially avoiding nutation of said second different species of nuclei, thereby causing NMR refocusing of said first species but not of said second species;
(c) define a complete MRI data acquisition sequence using said calculated spectrally-selective RF nutation pulse, which is to be applied without any concurrently applied magnetic gradient, followed by a time-spaced sequence of 180° RF refocusing pulses and phase-encoding magnetic gradient pulses to successively refocus said first species of NMR nuclei and to produce a respectively corresponding train of phase-encoded NMR RF spin echo responses emanating from said first species of NMR nuclei; and
(d) output to computer-readable memory said defined MRI data acqu sit on sequence for use in a diagnostic MRI scan.

23. Apparatus as in claim 22, wherein said programmed computer is further configured to:
provide an optimization option, depending upon a previously calculated design result, for repeating at least steps (a) and (b) using different input design specification data.

24. Apparatus as in claim 22, wherein said first species is water and said second species is fat or lipid.

25. Apparatus as in claim 24, wherein the programmed computer is configured to use a:
(a) half-width water refocusing bandwidth corresponding to at least 1.5 ppm, but less than 5.0 ppm at the NMR frequency of water; and
(b) half-width lipid rejection bandwidth corresponding to at least 1.5 ppm, but less than 5.0 ppm at the NMR frequency of lipid.

26. Apparatus as in claim 25, wherein the spectrally-selective RF nutation pulse is designed to be phase-modulated, of approximately 8 ms duration and to effect:
(a) a half-width water refocusing bandwidth corresponding to approximately 22 ppm at the NMR frequency of water; and
(b) a half-width lipid rejection bandwidth corresponding to approximately 2.4 ppm at the NMR frequency of lipid.

* * * * *